(12) United States Patent
Hayashi et al.

(10) Patent No.: US 6,961,113 B1
(45) Date of Patent: Nov. 1, 2005

(54) EXPOSURE METHOD AND APPARATUS

(75) Inventors: Yutaka Hayashi, Yokohama (JP);
 Osamu Yamashita, Musashino (JP);
 Masaya Iwasaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/979,749

(22) PCT Filed: May 26, 2000

(86) PCT No.: PCT/JP00/03389

§ 371 (c)(1),
(2), (4) Date: Feb. 8, 2002

(87) PCT Pub. No.: WO00/74120

PCT Pub. Date: Dec. 7, 2000

(30) Foreign Application Priority Data

May 28, 1999 (JP) ................................. 11-149598
Feb. 28, 2000 (JP) ............................. 2000-051106

(51) Int. Cl.[7] ........................ G03B 27/52; G03B 27/42
(52) U.S. Cl. ........................................ 355/30; 355/53
(58) Field of Search ...................... 355/30, 53, 72–76;
 118/719; 29/25.01

(56) References Cited

U.S. PATENT DOCUMENTS

| | | | |
|---|---|---|---|
| 4,125,130 A | | 11/1978 | Yamamoto ................. 138/121 |
| 5,496,628 A | * | 3/1996 | Ribbans .................... 448/285 |
| 5,877,843 A | * | 3/1999 | Takagi et al. ................ 355/30 |
| 6,333,775 B1 | * | 12/2001 | Haney et al. ................ 355/30 |
| 6,406,245 B2 | * | 6/2002 | Hasegawa et al. .......... 414/217 |
| 2003/0035095 A1 | | 2/2003 | Phillips et al. |

FOREIGN PATENT DOCUMENTS

| | | | |
|---|---|---|---|
| JP | | A 63-157419 | 6/1988 |
| JP | | A 63-260021 | 10/1988 |
| JP | | 4-136943 | * 5/1992 |
| JP | | A 4-136943 | 5/1992 |
| JP | | A 9-199402 | 7/1997 |
| JP | | A 10-149974 | 6/1998 |
| JP | | A 2000-195779 | 7/2000 |
| JP | | A 2001-35772 | 2/2001 |
| JP | | A 2001-35773 | 2/2001 |
| JP | | A 2001-189268 | 7/2001 |
| JP | | A 2001-210576 | 8/2001 |

* cited by examiner

Primary Examiner—Henry Hung Nguyen
(74) Attorney, Agent, or Firm—Oliff & Berridge, PLC

(57) ABSTRACT

An exposure apparatus transfers a pattern of a mask onto a substrate and includes a covering member which is disposed in the exposure apparatus and which substantially isolates a predetermined spacing from outside gas. The covering member includes a first thin film made of a first material which blocks penetration of the outside gas with respect to the predetermined spacing and a second thin film having a low degasification property and made of a second material of at least one of a metal and an inorganic substance. An exposure method transfers a pattern of a mask onto a substrate and includes the steps of isolating a part spacing of an optical path spacing for an exposure beam which transfers the pattern of the mask onto the substrate from outside gas by using such a covering member.

Figure 1:
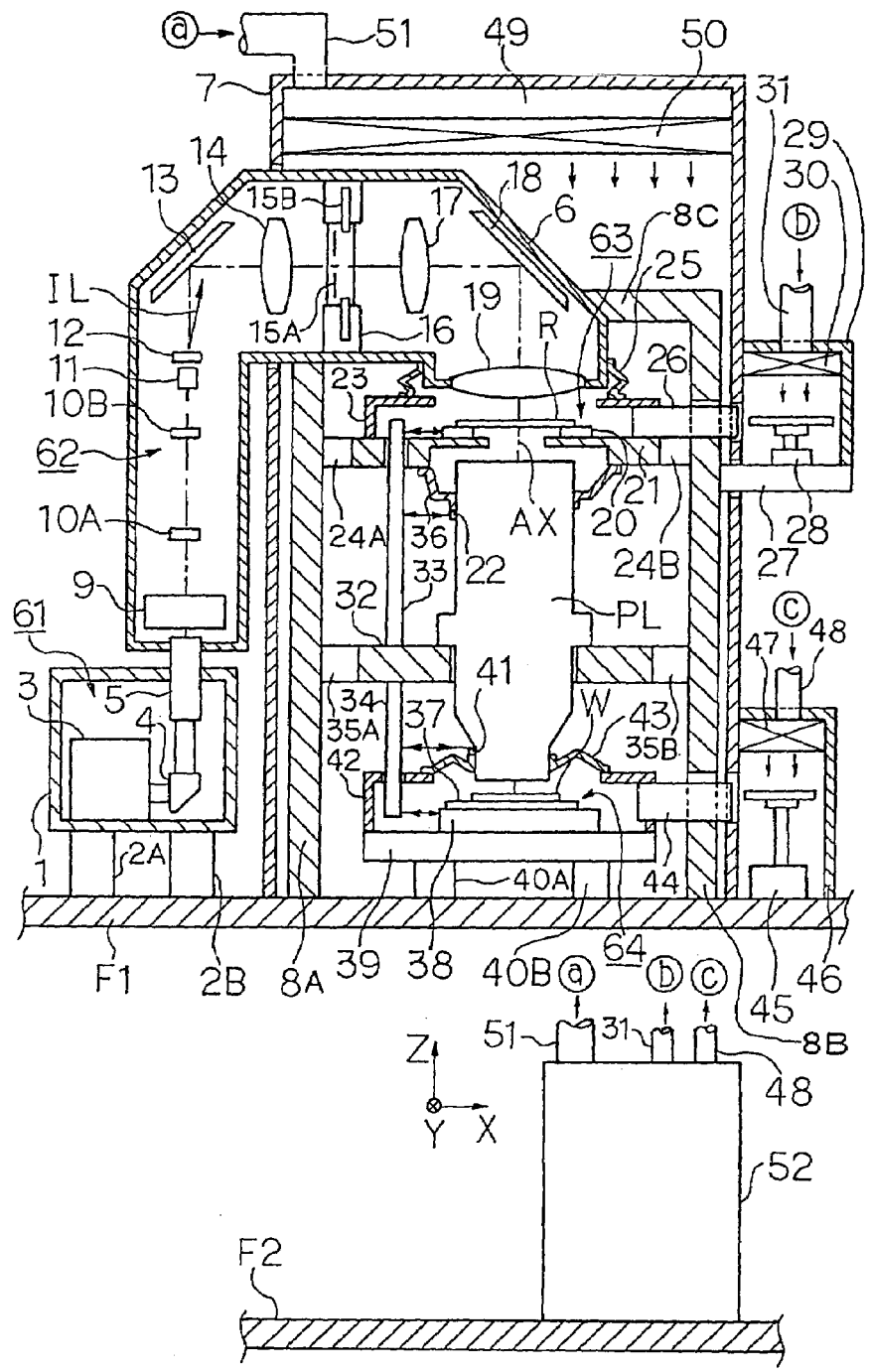

27 Claims, 5 Drawing Sheets

EXPOSURE METHOD AND APPARATUS

This application is the national phase under 35 U.S.C. §371 of prior PCT International Application No. PCT/JP00/03389 which has an International filing date of May 26, 2000 which designated the United States of America, the entire contents of which are hereby incorporated by reference.

DESCRIPTION

1. Technical Field

The present invention relates to an exposure apparatus which is used to transfer a mask pattern onto a substrate in a lithography method for manufacturing a device such as a semiconductor device, an image pickup device (such as a CCD), a liquid-crystal display device, a plasma display device, or a thin-film magnetic head. More particularly, the present invention is preferably used in using an exposure beam in a vacuum ultraviolet (VUV) radiation region having a wavelength of 200 nm or shorter.

2. Background Art

Generally a conventional exposure apparatus such as a stepper used to manufacture, for example, a semiconductor device, has a construction in which a wafer stage section, a reticle stage section, a projection optical system, an illumination optical system are mechanically integrated with each other. The integrated construction is supported on a floor via a vibration-isolating construction. In addition, a measuring system for measuring the position of a movable section of each stage on a basis of the projection optical system is attached to a portion of the integrated construction.

In the exposure apparatus of the above type, a very high resolving power needs to be increased to meet an improvement in integration density and fineness degree. The resolving power is proportionate to the wavelength of exposure light. For this reason, the exposure-light wavelength is shorter than that in a conventional case to an extent that KrF excimer laser light (having a wavelength of 248 nm) is recently used. At present, researches are in progress for use of ArF excimer laser light (having a wavelength of 193 nm) as well as $F_2$ laser light (having a wavelength of 157 nm). In addition, researches are in progress for use of light as an exposure beam which has a wavelength of 5 to 20 nm in a so-called extreme ultraviolet (EUV) radiation region.

For a projection exposure apparatus, the illuminance of an exposure beam is required to increase to improve the throughput. In this case, however, with a short wavelength of the exposure beam, absorption of the exposure beam according to gas on the optical path (ambient atmosphere) is caused to gradually increase. Specifically, when the wavelength of the exposure beam enters a state of a vacuum ultraviolet (VUV) radiation region having a wavelength of 200 nm or shorter as in the case of an ArF excimer laser light, the absorption of the exposure beam increases because of a substance (hereinbelow will be referred to as an "absorptive substance") such as oxygen, water vapor, and carbon dioxide contained in the ambient atmosphere of the exposure-beam optical path. When the wavelength of the exposure beam reaches a level of 180 nm or shorter, the absorption amount thereof particularly increases.

As such, when vacuum ultraviolet light is use as an exposure beam, to cause the exposure beam to be incident on a surface of a wafer at sufficient illuminance and to perform exposure with a practical throughput, the ambient atmosphere in most portions of the optical path of the exposure beam needs to be replaced with a purge gas that allows the exposure beam to transmit. Specifically, the ambient atmosphere needs to be replaced with gas (purge gas) such as a helium gas or a nitrogen gas that has a higher transmittance for the exposure beam than a transmittance of the absorptive substance.

Because of the above, a future exposure apparatus using vacuum ultraviolet light is preferably constructed such that a reticle stage system and a wafer stage system are individually stored in, for example, chambers having a high hermeticality. In addition, individual interlens spacings in a projection optical system are preferably formed as lens rooms having a high hermeticality, and the interiors thereof are individually replaced with gas that allows an exposure beam to transmit.

As described above, in the conventional exposure apparatus, the stage section, the projection optical system section, and the measuring system are integrated. Because of this construction, a problem occurs in that vibration of the movable section in the movable section propagates directly to the measuring system, providing adverse effects to stage control. In addition, a case can occur in which a part of the measuring system is deformed because of the movement of the movable section, causing a measurement error while it is very small.

Moreover, when a vacuum ultraviolet light such as an ArF excimer laser light is used as exposure light, most portions of the exposure optical path need to be purged with nitrogen, etc.; in the conventional exposure apparatus, it is not easy to make a boundary portion, particularly, between the stage section and the projection optical system section to be of a good hermetic construction. As such, to purge the boundary portion with nitrogen, a problem arises in that nitrogen or the like needs to be fed in a chamber covering substantially the entirety of the exposure apparatus, and a large apparatus configuration is necessary. On the other hand, when permitting an amount of, for example, air, to be mixed in the boundary portion, although the apparatus configuration is relatively simplified, a problem arises in that the exposure light is attenuated in the boundary portion and the light transmittances of optical components are reduced. The transmittances are reduced such that, for example, chemical reaction occurrs between small amounts of organic components in the air and the exposure light, and the chemical reaction causes adhesion of clouding materials, etc. onto surfaces of optical members.

In view of the above described problems, a first object of the present invention is to provide an exposure method that enables improvement in control precision of movable sections of stages.

A second object of the present invention is to reduce mixture of external gas when a high-transmittance gas is fed into at least a part of the exposure beam optical path.

A third object of the present invention is to provide an exposure method in which influence can be reduced of vibration occurring when a stage system and the like are driven, and high-precision exposure can thereby be implemented.

Furthermore, a fourth object of the present invention is to provide an exposure apparatus suitable for using the exposure method.

Still furthermore, a fifth object of the present invention is to provide a manufacturing method of the exposure apparatus, and a device manufacturing method capable of manufacturing a high precision device by using the exposure method or the exposure apparatus.

DISCLOSURE OF THE INVENTION

In a first exposure method according to the present invention which illuminates a first object with an exposure beam and exposes a second object through a projection system with the exposure beam passed through a pattern of the first object, a first stage system which positions the first object, the projection system, and a second stage system which positions the second object are supported in such a manner that vibration is not easily transmitted to each other.

According to the above-mentioned present invention, vibrations occurring when, for example, positioning and synchronous scanning are performed in the first stage system and the second stage system are not easily transmitted to the projection system. As such, by disposing a measuring system, which performs measurement for the position of a movable section of each of the stage systems on a basis of the projection system, in, for example, a member provided to support the projection system, high-precision measurement can be implemented for the positions of the movable section of each of the stage systems. In addition, a drive section is controlled according to the results of the measurement, thereby improving the control precision.

In a first exposure apparatus according to the present invention which illuminates a first object with an exposure beam from an illumination system and exposes a second object through a projection system with the exposure beam passed through a pattern of the first object, the first exposure apparatus comprises a first stage system which positions the first object; a second stage system which positions the second object; and support members to which the first stage system, the projection system, and the second stage system are respectively connected independently of each other via vibration-isolating members. According to the exposure apparatus, the first exposure method can be used therewith.

In this case, preferably, optical members in the projection system are configured to be substantially hermetically sealed in the projection system, and there are provided a first chamber which encloses optical members on the side of the first object of the illumination system, a second chamber which encloses the first stage system, a third subchamber which encloses the second stage system, and flexible connection members which hermetically seal portions between the first chamber, the second chamber, the projection system and the third chamber. Thereby, outside gas does not intrude into the optical path of the exposure beam boundary portions between, for example, the individual chambers, hence the clouding and the like on the optical member are reduced.

In addition, preferably, when vacuum ultraviolet light having a wavelength of 200 nm or shorter is used for the exposure beam, gases transmissive for the exposure beam are respectively fed into optical paths inside the first chamber, the second chamber, the projection system, and the third chamber. In this case, furthermore, when the boundary portions are the flexible connection members, reduction in the purities of the gases is minimized, and the transmittance of the exposure beam is therefore highly maintained.

In a second exposure method according to the present invention, which exposes an object with an exposure beam, two hermetic rooms in which inside spacings are respectively substantially isolated from outside gas are disposed to be adjacent to each other on an optical path of the exposure beam and on at least a portion of a transfer passageway for the object, a gas transmitting the exposure beam is fed into the two mutually adjacent hermetic rooms, and a spacing between the two mutually adjacent hermetic rooms is substantially sealed by using a covering member formed of a flexible filmy material.

A second exposure apparatus according to the present invention which exposes an object with an exposure beam, comprises: two hermetic rooms in which inside spacings are respectively substantially isolated from outside gas are disposed to be adjacent to each other on an optical path of the exposure beam and on at least a portion of a transfer passageway for the object; a gas feeding mechanism which exhausts gas in the two hermetic rooms and feeds a gas transmitting the exposure beam into the hermetic rooms; and a covering member formed of a flexible filmy material and provided to substantially seal a spacing between the two mutually adjacent hermetic rooms.

A third exposure apparatus according to the present invention which exposes a second object via a first object, comprises: two hermetic rooms in which inside spacings are respectively substantially isolated from an outside gas are disposed to be adjacent to each other on at least a portion of a transfer passageway for the first object; a gas feeding mechanism which exhausts gas in the two hermetic rooms and feeds a gas transmitting the exposure beam into the hermetic rooms; and a covering member formed of a flexible filmy material and provided to substantially seal a spacing between the two mutually adjacent hermetic rooms.

According to the second and third exposure apparatuses, the second exposure method according to the present invention can be implemented.

In the exposure apparatus according to the present invention, the connection member or the covering member preferably includes a thin-film formed of a first material (such as ethylene vinyl alcohol, polyamide, polyimide, or polyester) having a high shielding property against gas. Thereby, the purity of gas passing through the exposure beam in the inside of each of the hermetic rooms is highly maintained.

Preferably, a thin-film formed of a second material (such as inorganic material made of metal) having a low degasification property is applied onto an inner surface of the thin-film, which is formed of the first material, of the connection members or the covering member. In this case, since a degasification-caused gas occurring from the first material is blocked off by the second material, gas passing through the exposure beam in each of the individual hermetic rooms is maintained at a high purity.

The arrangement may be made such that a thin-film formed of a third material (such as polyethylene film) having a high expandability is applied through lamination processing onto an outer surface of the first material of the connection member or the covering member; the connection member or the covering member is rolled into a cylindrical shape; open ends of the cylindrical shape or the covering member are closed by welding portions of the third material at two end portions of the connection member or the covering member. There is a case where, while the first material exhibits a high gas-barrier property, but exhibits a relatively low expandability. However, the third material compensates for the expandability.

Each of first and second device-manufacturing methods according to the present invention includes a step of transferring a mask pattern onto a substrate provided as an object thereof by using the second exposure method of the present invention or one of second and third exposure apparatuses. According to this present invention, since the second exposure method of the present invention or one of second and third exposure apparatuses is used, a high-precision exposure can be implemented by reducing influences of vibrations. Consequently, a high-function-level device can be manufactured.

In a first manufacturing method according to the present invention of an exposure apparatus which illuminates a first object with an exposure beam from an illumination system and exposes a second object with the exposure beam passed through a pattern of the first object through a projection system, the first exposure apparatus manufacturing method performs assembly of the illumination system, the projection system, a first stage system which positions the first object, a second stage system for positions the second object, support members to which the first stage system, the projection system and the second stage system are respectively connected independently of each other via vibration-isolating members according to a predetermined positional relationship.

Each of third and fourth device-manufacturing methods according to the present invention includes a step of transferring a mask pattern onto a substrate as a second object by respectively using the first exposure method or the first exposure apparatus of the present invention. According to the present invention, since the first exposure method or the first exposure apparatus of the present invention is used, a high-precision exposure can be implemented by improving the control precision for movable section of stage systems. Consequently, a high-function-level device can be manufactured.

A second exposure apparatus manufacturing method according to the present invention, in an exposure apparatus manufacturing method which exposes an object with an exposure beam, performs assembly of two hermetic rooms in which inside spacings are respectively substantially isolated from outside gas are disposed to be adjacent to each other on an optical path of the exposure beam and on at least a portion of a transfer passageway for the object, a gas feeding mechanism which exhausts gas in the two hermetic rooms and feeds a gas transmitting the exposure beam into the hermetic rooms, and a covering member formed of a flexible filmy material and provided to substantially seal a spacing between the two mutually adjacent hermetic rooms according to a predetermined positional relationship.

A third exposure apparatus manufacturing method according to the present invention, in an exposure apparatus manufacturing method which exposes a second object via a first object with an exposure beam, performs assembly of two hermetic rooms in which inside spacings are respectively substantially isolated from outside gas are disposed to be adjacent to each other on at least a portion of a transfer passageway for the first object, a gas feeding mechanism which exhausts gas in the two hermetic rooms and feeds a gas transmitting the exposure beam into the hermetic rooms, and a covering member formed of a flexible filmy material and provided to substantially seal a spacing between the two mutually adjacent hermetic rooms according to a predetermined positional relationship.

Figure 2:
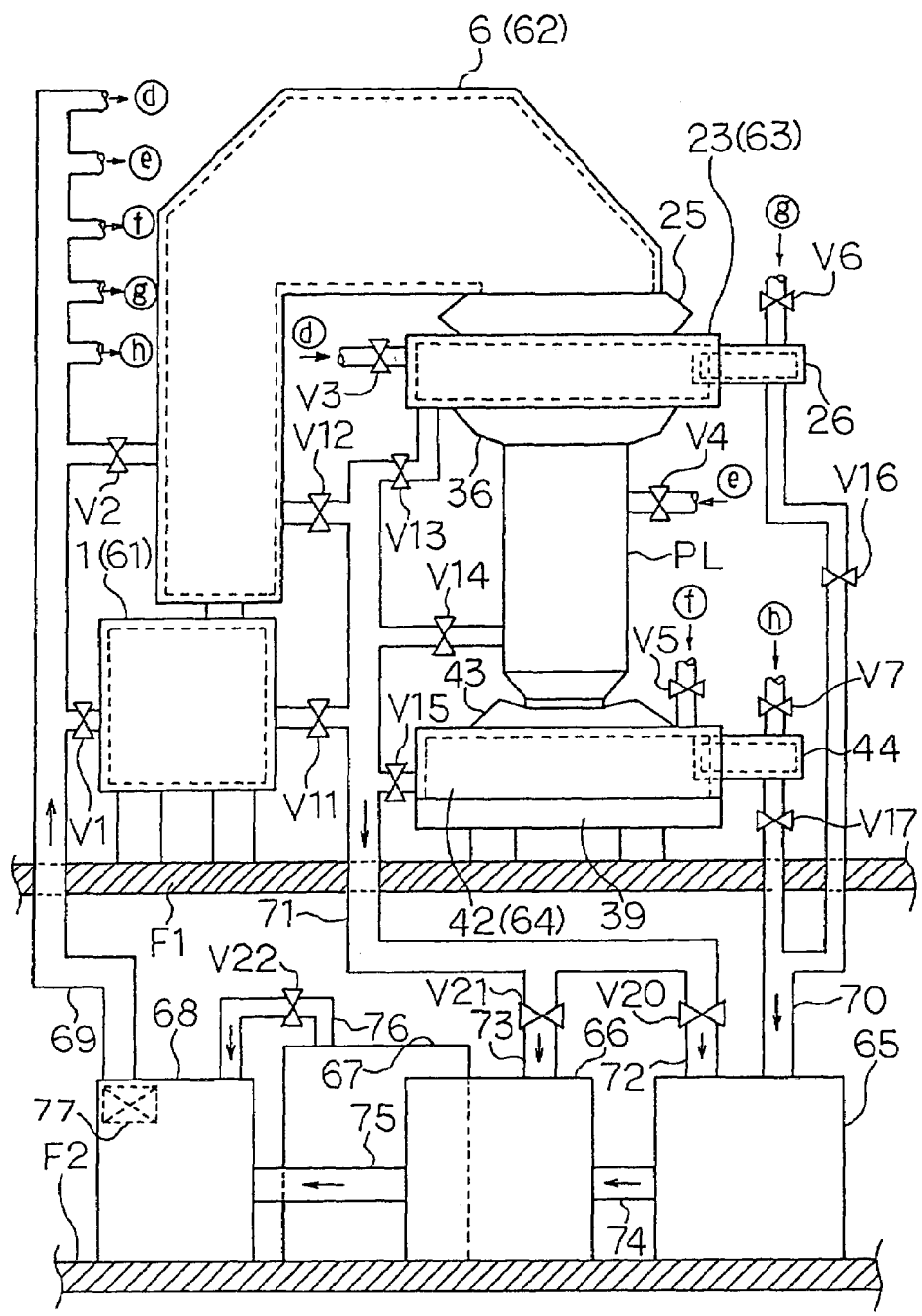
Figure 3:
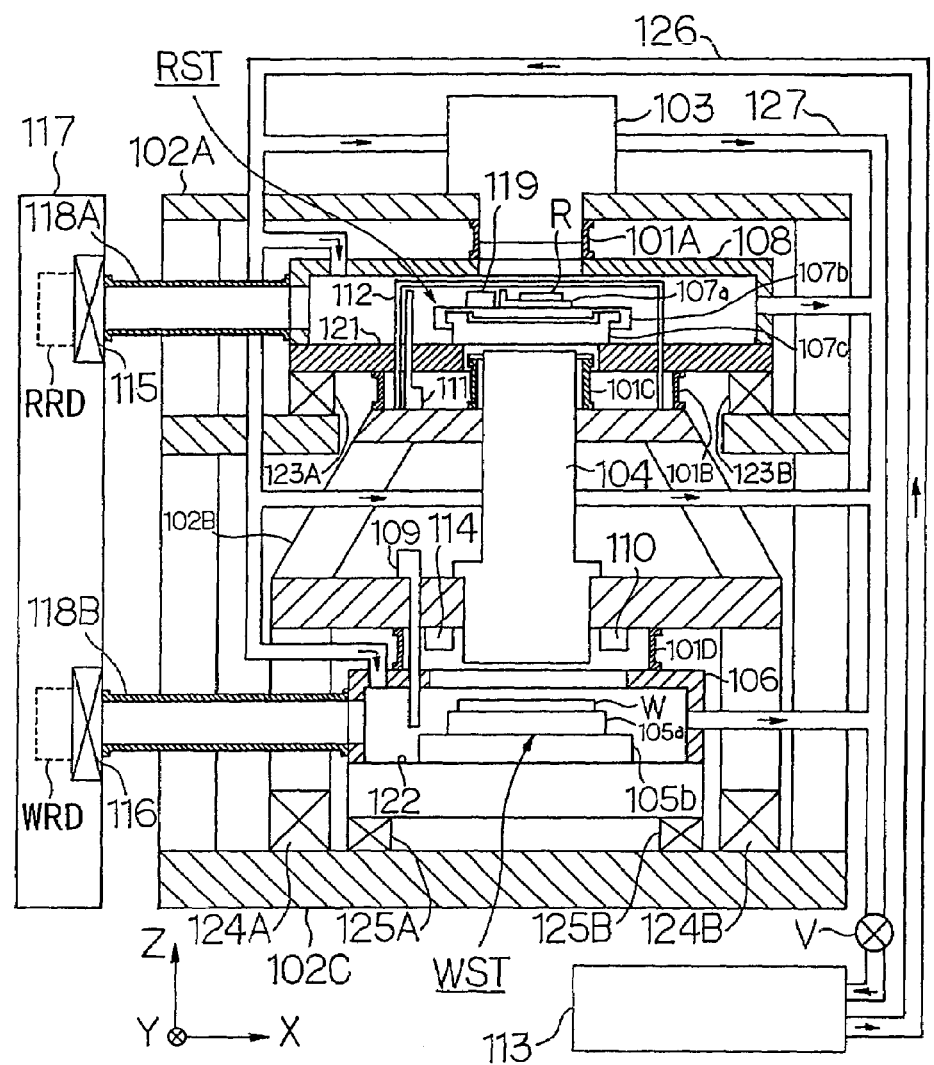
Figure 4:
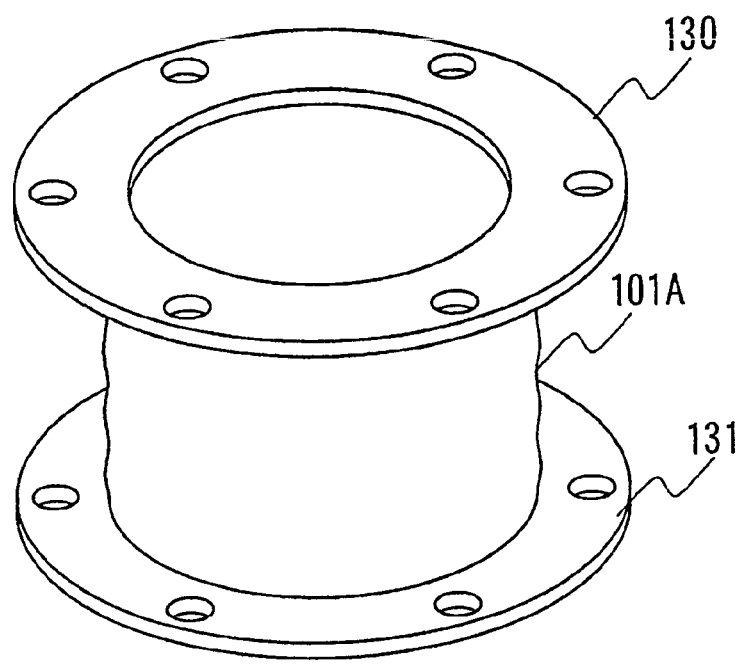
Figure 5:
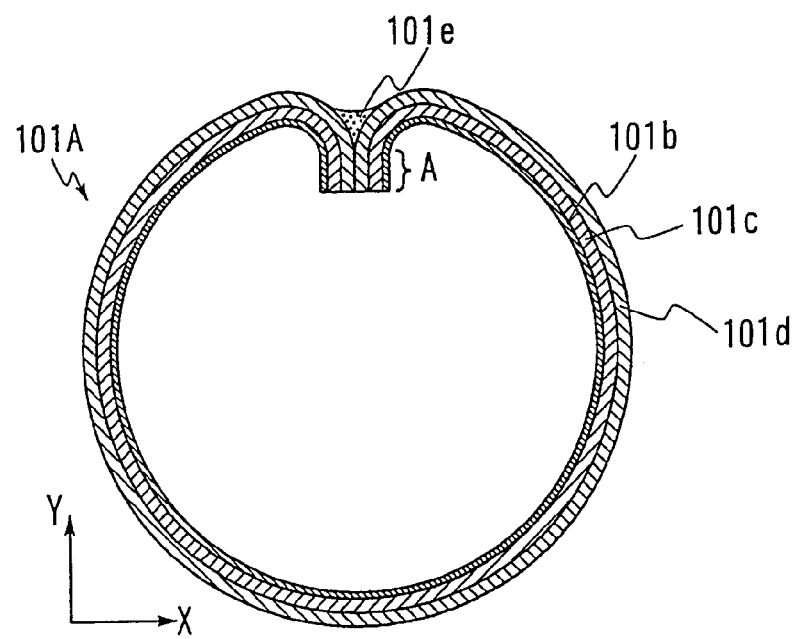
Figure 6A:
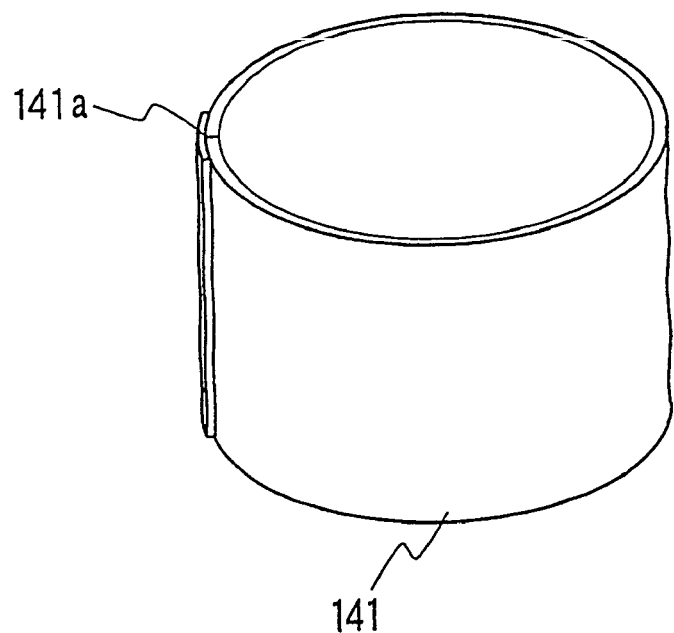
Figure 6B:
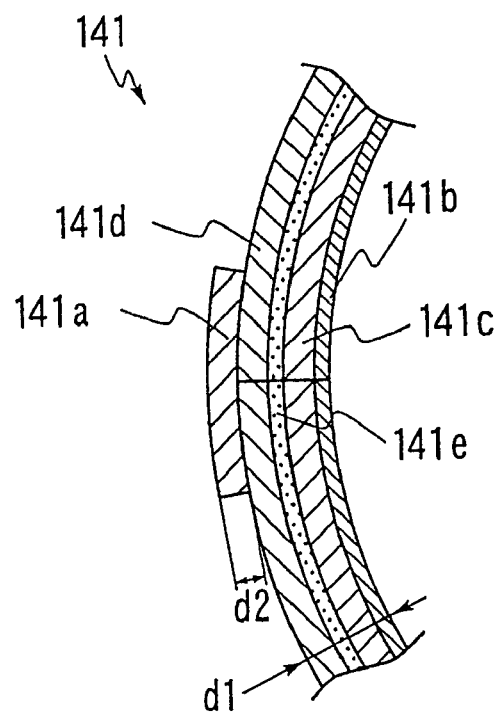

FIG. 1 is a cross sectional view showing overall configurations of a projection exposure apparatus and an air-conditioner according to a first embodiment of the present invention. FIG. 2 is a partially-cutaway schematic configuration view showing a gas-circulating system. FIG. 3 is a partially-cutaway schematic configuration view showing a projection exposure apparatus according to a second embodiment of the present invention. FIG. 4 is a perspective view showing a filmy cover 101A. FIG. 5 is a thickness-wise-enlarged transverse cross sectional view showing the filmy cover 101A shown in FIG. 3. FIG. 6A is a perspective view showing a filmy cover 141 according to another embodiment of the present invention; and FIG. 6B is thickness-wise-enlarged transverse cross sectional view showing a part of the filmy cover 141.

BEST MODE FOR CARRYING OUT THE INVENTION

Hereinbelow, a preferred first embodiment of the present invention will be described with reference to the accompanying drawings. The present embodiment represents an example in which the present invention is applied to a projection exposure apparatus employing a step-and-scan method by which a high-transmittance gas is fed to most portions of the exposure optical path.

FIG. 1 shows overall configurations of a projection exposure apparatus and an air-conditioner according to the present embodiment. Referring to FIG. 1, a projection exposure apparatus is disposed in a clean room on a floor F1 of a story of a semiconductor-manufacturing plant. In a so-called machine room (utility space) on a floor F2 of a downstairs thereof, there is situated the air-conditioner for feeding air regulated in temperature into peripheral portions of the projection exposure apparatus on the upstairs. On the floor F2, there is situated a gas-circulating apparatus for circulating the high-transmittance gas to the exposure optical paths of the projection exposure apparatus (refer to FIG. 2). In this way, the apparatus that tends to producing dust and to be a vibrating source is situated on the floor different from the floor whereon the projection exposure apparatus is situated. This arrangement enables the cleanliness in the clean room, in which the projection exposure apparatus is provided, to be substantially high. Furthermore, the arrangement enables a reduction in the influence of vibration to the projection exposure apparatus. In this configuration, a light-source system 61 (described below) may be situated on the floor F2.

In the clean room, the projection exposure apparatus is situated that is configured to include the light-source system 61, an illumination system 62, a reticle stage system 63, a projection optical system PL, and a wafer stage system 64. The light-source system 61 and the illumination system 62 together constitute an illumination optical system. To support the projection exposure apparatus, columns 8A and 8B are securely fixed onto the floor F1, in which upper portions of the columns 8A and 8B are connected through a ceiling plate 8C. The floor F1 and the columns 8A and 8B in the present embodiment (shown in FIG. 1) correspond to support members of the present invention. However, as disclosed in a below- described second embodiment (shown in FIG. 3), the projection exposure apparatus may be placed on a floor via a base member (102C). Alternatively, a base table 39 on which the wafer stage system 64 is placed may be hanged from the columns 8A and 8B through a frame. The base member and the columns 8A and 8B in the former case correspond to the support members of the present invention; and the columns 8A and 8B in the latter case correspond to the support member of the present invention.

The light-source system 61 and the illumination system 62 are stored respectively in a box-like subchamber 1 having a high hermeticality and second a second subchamber 6. The first subchamber 1 is disposed on the floor F1 via vibration-isolating blocks 2A and 2B. The second subchamber 6, in which the illumination system 62 is stored, is directly fixed onto an upper portion of the column 8A and a portion of the ceiling plate 8C. The wafer stage system 64 is disposed on the floor F1 between the columns 8A and 8B via vibration-isolating blocks 40A and 40B. Each of the vibration-isolating blocks 40A and 40B is an active vibration-isolating mechanism formed by combining, for example, an air damper and electromagnetic damper employing a method using a voice coil motor (VCM). A lens housing for the illumination system 62 may be stored in the second subchamber 6 as a housing. However, the hermeticality of the lens housing for the illumination system 62 may be increased, and the lens housing may be used as the second subchamber 6 (which corresponds to a first chamber of the present invention). The essential is that the subchambers are not limited by the housings.

In a portion between columns 8A and 8B, a support plate 32 is placed on an upper portion of the wafer stage system 64 via a vibration-isolating mechanisms 35A and 35B. The projection optical system PL is disposed on an opening in a central portion of the support plate 32. The reticle stage system 63 is disposed on an upper portion of the projection optical system PL between the columns 8A and 8B via vibration-isolating mechanisms 24A and 24B. For the individual vibration-isolating mechanisms 35A, 35B, 24A, and 24B, for example, a horizontally expandable air damper or hydraulic damper is usable. Thus, in the present embodiment, the reticle stage system 63 is provided as a first stage system, the projection optical system PL is provided as a projection system, and the wafer stage system 64 is provided as a second stage system. The members are individually supported by the first subchamber 1 and the columns 8A and 8B in a state in which vibrations thereof are not easily propagated to each other. The illumination system 62 almost does not cause vibrations; hence, even when it is directly fixed to, for example, the column 8A, no adverse effects occur. However, at least a portion of the illumination system 62 may be disposed to be isolated away from the columns 8A and 8B. For example, the configuration may be arranged such that the illumination optical system is separated into two with a below described fixed blind 15A, the fixed blind 15A and the optical system situated closer than the fixed blind 15A are provided on the main unit side (columns 8A and 8B), and other members are provided on a different frame. In this case, movable or replaceable optical devices (such as a movable blind 15B) are preferably disposed on the different frame. In addition, on the side of the main unit, a sensor is preferably provided that detects the relative positional relationship between at least a portion of the separated illumination system 62 and components (such as the reticle stage system 63 and projection optical system PL).

The reticle stage system 63 and the wafer stage system 64 are stored in high-hermeticality box-like third subchamber 23 and fourth subchamber 24, respectively. Spacings between individual optical members in the projection optical system PL are substantially hermetically enclosed as hermetic rooms. In the present embodiment, while an ArF excimer laser (having a wavelength of 193 nm) is used as an exposure beam, such vacuum ultraviolet light is substantially absorbed by oxygen. In consideration of the above, in the present embodiment, to prevent attenuation occurring in the exposure-beam optical path, a nitrogen gas ($N_2$) is fed into the exposure-beam optical path as a gas that has a high transmittance and that is chemically stable. As an alternative gas that has a high-transmittance and that is chemically stable, for example, helium gas (He) may be used. However, since nitrogen is more inexpensive than helium, the present embodiment uses the nitrogen gas.

In the present embodiment, a gas-circulating system (described below) is provided to purge the inside of the individual first to fourth subchambers 1, 6, 23, and 42 with high-purity nitrogen gas. In addition, high-purity nitrogen gas is fed to purge the inside of the hermetic rooms in the projection optical system PL. Furthermore, bellows 25, 36, and 43, such as stainless steel bellows, which have flexibility of a certain level with a deformation amount that does not increase so much, are connected, respectively, to a boundary portion between the second subchamber 6 and the third subchamber 23, a boundary portion between a bottom surface of the reticle stage system 63 and an upper portion of the projection optical system PL, and a boundary portion between a lower portion of the projection optical system PL and the fourth subchamber 42. For the bellows 25, 36, and 43, a material (such as metal) having a low degasification property is preferably used. Alternatively, a Teflon-coated material may be used for the bellows 25, 36, and 43. Still alternatively, a material such as synthetic resin or synthetic rubber may be used. Also in this case, degasification-preventing coating is preferably applied. With these bellows 25, 36, and 43, the boundary portions are substantially hermetically enclosed, and substantially, the entirety of the exposure-beam optical path is hermetically enclosed. As a result, the configuration allows almost no outside impure gas to intrude into the exposure-beam optical paths, and hence the attenuation amount of the exposure beam is significantly reduced.

Hereinbelow, the configuration of the projection exposure apparatus according to the present invention will be described. In the first subchamber 1, an exposure light source 3, a beam-matching unit 4 (BMU), and a pipe 5 are disposed. The exposure light source 3 is formed of an ArF excimer laser light source. The BMU 4 includes a movable mirror used to perform positional matching for the optical path in the field to the exposure main unit section. The pipe 5 is formed of a light-shielding material, and it transmits the exposure beam. At the time of exposure, ultraviolet pulse light IL emitted from the exposure light source 3 as an exposure beam having a wavelength of 193 nm passes through the inside of the BMU 4 and the pipe 5, and enters the second subchamber 6. In the second subchamber 6, the ultraviolet pulse light IL passes through a beam-shaping optical system, and is led to be incident on a fly's eye lens 11 that functions as an optical integrator (homogenizer). The beam-shaping optical system is formed to include a variable attenuation device 9 that functions as a light attenuator, and lens systems 10A and 10B. On an exit surface of the fly's eye lens 11, an aperture diaphragm system 12 of an illumination system is installed. The aperture diaphragm system 12 changes the illumination condition in various ways.

Thus, the ultraviolet pulse light IL emitted from the fly's eye lens 11 passes through the predetermined aperture diaphragm, and is then led to be incident on a fixed illumination view-field aperture 15A (fixed blind) and a movable blind 15B through a reflection mirror 13 and a condenser lens system 14. The fixed illumination view-field aperture 15A (fixed blind) includes a slit-like opening section in a reticle blind mechanism 16. The movable blind 15B functions to make the width of an illumination view-field region in a scan direction to be variable independently of the fixed blind 15A. The movable blind 15B is used to implement reductions in scan-directional movement stroke of the reticle stage as well as in width of a light-shielding zone of a reticle R.

The ultraviolet pulse light IL shaped as a slit through the fixed blind 15A of the reticle blind mechanism 16 radiates a slit-like illumination region in a circuit pattern region of the reticle R in a uniform integrity distribution. The light IL is thus radiated through an imaging lens system 17, a reflection mirror 18, and a primary condenser lens system 19. In the present embodiment, the illumination system 62 is configured to include optical members provided in the portion from the variable extinction device 9 to the primary condenser lens system 19.

Under the ultraviolet pulse light IL, a circuit-pattern image in the illumination region of the reticle R is transferred onto a slit-like exposure region of a resist layer on a wafer W through the projection optical system PL. The exposure region is positioned in one of a plurality of shot regions on the wafer W. The projection optical system PL of the present embodiment is a dioptric system. However, availability is limited for glass materials capable of transmitting the ultraviolet light having the short wavelength is limited. As such, for the projection optical system PL, either a catadioptric system or a reflection system may be used to increase the transmittance of the ultraviolet pulse light IL. Hereinbelow, a description will be made on a basis of X, Y, and Z axes as shown in the figure. The Z axis is established parallel to an optical axis AX of the projection optical system PL. The X axis established parallel to the sheet face of FIG. 1 in a plane that is perpendicular to the Z axis (substantially horizontal plane in the present invention). The Y axis established perpendicular to the sheet face of FIG. 1.

The reticle R is adsorbed and held on a reticle stage 20. The reticle stage 20 is layered to be uniformly movable on a reticle base 21 in the X direction (scan direction). In addition, the reticle R is uniformly movable in the X-direction, the Y direction, and the rotational direction. A movable mirror (not shown) is fixedly arranged, and a reference mirror 22 is also fixedly arranged on an upper side face of the projection optical system PL. A reticle-dedicated interferometer main body portion 33 is fixedly arranged on the support plate 32 that supports the projection optical system PL. An upper portion of the reticle interferometer main body portion 33 reaches an interior of the third subchamber 23 through an opening of the reticle base 21. A circumferential opening of the interferometer main body portion 33 is seal-blocked with, for example, a resin material that has elasticity and a low degasification property. A laser beam is radiated from the interferometer main body portion 33 to the movable mirror of the reticle stage 20 and to the reference mirror 22 of the projection optical system PL. On the basis of the reference mirror 22 (projection optical system PL), the interferometer main body portion 33 measures two-dimensional position of the reticle stage 20 and the rotational angle thereof, and feeds the measurement result to a drive controller (not shown). Thus, the reticle stage system 63 is configured to include the reticle stage 20 and the reticle base 21. The interferometer main body portion 33 corresponds to a first measuring system of the present invention.

The wafer W is adsorbed and held on a wafer holder 37. The wafer holder 37 is fixedly arranged on a wafer stage 38, and the wafer stage 38 is disposed on the base table 39. The wafer stage 38 employing an autofocus method controls a focus position (position in the Z direction) of the wafer W and a tilt angle thereof. Thereby, the wafer stage 38 aligns the surface of the wafer W with an image plane of the projection optical system PL. In addition, the wafer stage 38 performs equal-velocity scanning of the wafer W in the X direction as well as stepping thereof in the X and Y directions. In addition, a movable mirror (not shown) is fixedly arranged on a side face of the wafer stage 38, and a reference mirror 41 is fixedly arranged on a lower side face of the projection optical system PL. A wafer-dedicated interferometer main body portion 34 is fixedly arranged onto the support plate 32 that supports the projection optical system PL. A lower portion of the interferometer main body portion 34 reaches an upper portion of the base table 39 in the fourth subchamber 42. A gap between an opening of the fourth subchamber 42 and the interferometer main body 34 is seal-blocked with, for example, a resin material that has elasticity and a low degasification property.

A laser beam is radiated from the interferometer main body portion 34 to the movable mirror of the wafer stage 38 and to the reference mirror 41 of the projection optical system PL. On the basis of the reference mirror 41 (projection optical system PL), the interferometer main body portion 34 measures two-dimensional position of the wafer stage 38 and the rotational angle (including a yawing amount, a pitching amount, and a rolling amount) thereof, and feeds the measurement result to a drive controller (not shown). The reticle stage system 64 is configured to include the wafer holder 37, the wafer stage 38, and the base table 39. The interferometer main body portion 34 corresponds to a second measuring system of the present invention. Preferably, measuring sensors are provided on the support plate 32 as a measuring system. For example, the measuring system preferably includes a sensor for measuring the gap and the tilt angle in the Z direction of the reticle base 21 with respect to the projection optical system PL, and a sensor for measuring the gap and the tilt angle in the Z direction of the base table 39 with respect to the projection optical system PL. In a scan-exposure operation, the reticle R is scanned via the reticle stage 20 for an illumination region of the ultraviolet pulse light IL in the +X direction (or in the −X direction) at a velocity Vr. In synchronization with the scanning, the wafer W is scanned for an exposure region via the wafer stage 38 in the −X direction (or in the +X direction) at a velocity of β·Vr (β represents the projection magnification from the reticle R to the wafer W). The scan directions for the reticle R and the wafer W is arranged to oppose each other for the reason that the projection optical system PL performs reverse projection.

In the present embodiment, a box-like chamber 7 that is large as a whole is used to house the columns 8A and 8B, the reticle-side portion of the second subchamber 6 in which the illumination system 62 is housed, the third subchamber 23, the projection optical system PL, and the fourth subchamber 42. On an upper portion of the chamber 7, temperature-regulated air is fed from an air-conditioner 52 provided on the floor F2 of the downstairs. The air that has thus been fed then passes through a diffusion section 49 and enters a filter section 50 that includes a dust filter, such as a HEPA filter (high efficiency particulate air-filter), and a chemical filter for removing a small amount of organic substance. Then, the air passed through the filter section 50 is led flow downwardly around the second to fourth subchambers 6 to 42, and is discharged from an opening (not shown) provided in a bottom portion of the chamber 7. Thereby, the temperature around the second to fourth subchambers 6 to 42 of the present embodiment is maintained substantially to be constant.

A load-lock chamber 26 is provided in a portion from an end portion on the reticle base 21 to an opening portion of the column 8B and an opening portion of the chamber 7. The load-lock chamber 26 delivers reticles between the reticle stage system 63 and the outside and to hold an in-process reticle substantially in a complete hermetic state. Furthermore, a reticle loader system 28 is fixed onto a side face of the column 8B and onto a support plate 27 that has passed through the opening of the chamber 7. A fifth subchamber 29 is provided such as to enclose the reticle loader system 28. Shuttable doors are individually disposed on faces opposing the reticle loader system 28 and the reticle base 21, and the peripheral portions of the load-lock chamber 26 are hermetically enclosed.

A load-lock chamber 44 is provided in a portion from an end portion on the base table 39 to the opening portion of the column 8B and the opening portion of the chamber 7. The load-lock chamber 44 delivers reticles between the wafer stage system 64 and the outside. A wafer loader system 45 is provided so as to be in contact with a side face of the load-lock chamber 44 to deliver wafers between itself and an a transfer line (not shown). The wafer loader system 45 is fixed onto the floor F1. The sixth subchamber 46 is provided to enclose the wafer loader system 45. A pair of shuttable doors is disposed for the load-lock chamber 44. Temperature-regulated air is fed from the air-conditioner 52 to upper portions of the respective fifth subchamber 29 and sixth subchamber 46 via a pipeline 31 and a pipeline 48. The air fed thereto passes through filter sections 30 and 47. The air is led to flow in lower proportions around the individual reticle loader system 28 and wafer loader system 45, and is then exhausting.

As described above, in the present embodiment, although temperature-regulated air flows outside of the second to fourth subchambers 6 to 42, the hermeticality of the second to fourth subchambers 6 to 42 is high. Furthermore, the bellows 25, 36, and 43 are provided. Consequently, almost no air intrudes into the optical path of the ultraviolet pulse light IL, and the use efficiency of the ultraviolet pulse light IL can be highly maintained. However, in a configuration in which the hermeticality of subchambers surrounding individual portions of a projection exposure apparatus is low, an inert gas having a high transmittance, such as a nitrogen gas, should be fed to flow in the entirety of the chamber 7. In this case, a problem arises in that an expensive temperature-regulating facility needs to be provided, thereby increasing operation costs.

In addition, in the present embodiment, temperature-regulated air is fed also into peripheral portions of the reticle loader system 28 and the wafer loader system 45. Furthermore, the load-lock chamber 26 and the load-lock chamber 44 are individually disposed in the portion between the fifth subchamber 29 and the sixth subchamber 46 in the portion between the third subchamber 23 and the load-lock chamber 44. As such, for example, when replacing the reticle R, the right door is shut, and the reticle R is stored in the load-lock chamber 26; and after the right and left doors are air-tightly shut, the reticle R is replaced with another reticle. Thereafter, the right and left doors of the load-lock chamber 26 are shut, an exhausting unit (described below) is used to exhaust the inside, and the nitrogen gas is then hermetically enclosed. Subsequently, the left door is opened, and the reticle in the load-lock chamber 26 is loaded onto the reticle stage 20. Thereby, intrusion of air on the side of the reticle loader system 28 into the third subchamber 23 is prevented. By performing similar operations, intrusion of air on the side of the wafer loader system 45 into the fourth subchamber 42 is prevented. With the load-lock chambers 26 and 44 each provided as a delivery-dedicated chamber, temperature-regulated air can also be led to flow around the reticle loader system 28 and the wafer loader system 45.

In the above-described present embodiment, preferably, stainless steel materials are used for, or alternatively, Teflon coating is applied to materials of members, such as the subchamber 6, 23, and 42, or members disposed therein, for example, portions of the interferometer main body portions 33 and 34, to minimize degasification.

Hereinbelow, a configuration of a gas-circulating system in the projection exposure apparatus of the present embodiment will be described referring to FIG. 2. In FIG. 2, the same reference numerals are used to represent portions corresponding to those shown in FIG. 1, and descriptions thereof are omitted herefrom.

FIG. 2 shows the gas-circulating system of the projection exposure unit according to the present embodiment. Referring to FIG. 2, on the floor F2 of the downstairs of the floor F1, there are provided an exhausting unit 65 including a vacuum pump, a nitrogen-gas collecting unit 66, a storage unit 67 for storing high-purity nitrogen in the form of liquid nitrogen or the like, and a temperature-regulating unit 68 for regulating the temperature of nitrogen gas and for feeding the gas to the outside. The exhausting unit 65 selectively absorbs gas to be in a vacuum state via two exhausting pipelines 70 and 72, and feeds the adsorbed gas into the collecting unit 66 via a pipeline 74. The collecting unit 66 is configured to include an absorbing section, a separating section, a storage section, and a feeding section. The absorbing section absorbs gas from an exhausting pipeline 73. The separating section separates nitrogen gas from the gas fed from the absorbing section and gas collected via the pipeline 74. The storage section temporarily stores the separated nitrogen gas. The feeding section feeds the stored gas to the temperature-regulating unit 68 via a pipeline 75. The storage unit 67 feeds the stored nitrogen as needs arises to the temperature-regulating unit 68 through a pipeline 76 to which a valve V22 is connected. The temperature- regulating unit 68 includes a temperature control section, a gas-blowing section, and a filter section 77. The temperature control section controls the temperature of gas (a nitrogen gas, in this particular case) fed via the pipelines 75 and 76. As needs arises, the gas-blowing section blows the gas fed from the temperature control section. The filter section 77 includes a HEPA filter and a chemical filter for removing dust from the blown gas. The air passed through the filter section 77 is fed into a gas-feeding pipe 69.

The filter section 77 removes impurities (contaminants) in addition to dust and moisture. Impurities to be removed by the filter section 77 include substances that adhere to the exposure light source 3, optical elements of the illumination optical system, and the projection optical system PL to thereby cause the elements to be cloudy. The impurities to be removed also include substances that flow along the optical path of the exposure beam and causes variations in, for example, the transmittance (illumination) or the illumination distribution of the illumination optical system and the projection optical system PL. In addition, the impurities to be removed include substances that adhere onto a surface of the wafer W (resist) to thereby cause a postdevelopment pattern image to vary. A usable filter for a part of the filters in the filter section 77 is an active-carbon filter (for example, "GIGASORB" (brand name) produced by Nitta Corp.), a zeolite filter, or a filter formed by combining the filters. The filters remove silicon organic substances, such as siloxanes (substance containing a chain of Si—O as a base) or silazanes (substance containing a chain of Si—N as a base). The collecting unit 66 and the temperature-regulating unit 68 in FIG. 2 correspond to a gas-circulating unit of the present invention.

The projection exposure apparatus on the floor F1 is configured as follows. An end portion of the gas-feeding pipe 69 extending from the downstairs branches to a first branch pipe having a valve V1 to a seventh branch pipe having a valve V7. The first branch pipe having the valve V1 is connected to a first chamber 1 (light-source system 61). A second branch pipe having the valve V2 is connected to a second subchamber 6 (illumination system 62). The third branch pipe having the valve V3 is connected to a third subchamber 23 (reticle stage system 63). The fourth branch pipe having the valve V4 is connected to a hermetic room of the projection optical system PL. The fifth branch pipe having the valve V5 is connected to a fourth subchamber 42 (wafer stage system 64). The sixth branch pipe having the valve V6 and seventh branch pipe having the valve V7 are connected to load-lock chambers 26 and 44, respectively. As such, in the configuration, according to a blowing operation for gas from the temperature-regulating unit 68 and a selective on/off operation of one of the valves V1 to V7, transmissive gas (nitrogen gas in this particular case) can be appropriately fed to purge any one of the hermetic rooms of first subchamber 1 to the load-lock chamber 44 for the exposure beam.

The first subchamber 1 to the third subchamber 23, the hermetic room of the projection optical system PL, and the fourth subchamber 42 are individually connected to an exhaust pipeline 71 through branch pipes individually having valves V11 to V15. As such, according to a selective on/off operation of valves V20 or 21, gas in the first subchamber 1 to the fourth subchamber 42 can be exhausted by using one of the exhausting unit 65 and the collecting unit 66. The load-lock chambers 26 and 44 are individually connected to an exhausting pipeline 70 through branch pipes individually having valves V16 and V17. As such, according to an on/off operation of the valves 16 and 17, gas in each of the load-lock chambers 26 and 44 can be appropriately exhausted using the exhausting unit 65 to an extent that each of the load-lock chambers 26 and 44 becomes in a vacuum state.

A pressure sensor and a impurity sensor (an oxygen concentration meter may be used) for detecting the concentration of impurities such as oxygen are provided in each of the first subchamber 1 to the load-lock chamber 44. When the detection result of the impurity sensor exceeds a tolerance, it is preferable that gas in the corresponding hermetic room or chamber is exhausted, and a transmissive gas is fed into the corresponding chamber and hermetic room to set the pressure detected by the pressure sensor to a predetermined reference pressure (for example, a level of the atmospheric pressure).

Hereinbelow, a description will be made regarding example operations for circulating a transmissive gas into individual portions of the projection exposure apparatus. When the first to fourth subchambers 1 to 42 are full of air at the time of, for example, operation commencement of the exposure apparatus, the valves V1 to V5 and V21 are controlled to shut, and valves V11 to V15 and V20 are controlled to open. Thereby, and the air is abruptly exhausted. After exhausted amount has reached a certain level, the valves V11 and V15 are controlled to shut, valves V1 to V5 are controlled to open, and a transmissive gas is thereby fed from the temperature-regulating unit 68 into the first to fourth subchambers 1 to 42. Then, exhaustion and feed operations are iterated using the exhausting unit 65 until the concentration of impurities (such as oxygen) reaches a level of the tolerance.

After the impurity concentration has reached a level of the tolerance, the valve V20 is controlled to shut, and exposure operation is controlled to commence. During the exposure operation, when the impurity concentration in one of the first to fourth subchambers 1 to 42 has increased, a certain amount of gas is exhausted through the collecting unit 66 to replace the gas therein. Then, purging with the transmissive gas is done through the temperature-regulating unit 68. These operations enable the transmissive-gas consumption as well as operation costs to be reduced.

When the reticle or the wafer is to be replaced, as already described, the reticle or a wafer to be subsequently used is stored in the load-lock chamber 26 or 44, and the right and left doors are locked. In this state, abrupt exhaustion is performed using the exhausting unit 65, and concurrently, gas is fed into the rooms from the temperature-regulating unit 68. These operations enable the amount of impurity intrusion from the reticle loader system or the wafer loader system into the side of the optical path to be substantially removed. Thus, the configuration has an advantage in that the exposure-step throughput almost does not decrease.

In the arrangement of the present embodiment, the same type of gas (nitrogen gas in this particular case) that is transmissive and stable is fed into the first to fourth subchambers 1 to 42. However, the arrangement may be modified such that a different type of transmissive and stable gas, for example, as a helium gas, is fed into portions as the interior portion of the projection optical system PL for which stability in optical property is particularly required. Although the helium gas is expensive, it has an excellent property in radiation effects. The thermal conductivity of the helium gas is six times higher than that of the nitrogen gas. In addition, since the helium gas has a less-variable refraction index, it exhibits advantages in, for example, image-forming property. In this view, using the helium gas prevents the increase in the operation costs.

According to the arrangement of the present embodiment, in the collecting unit 66 shown in FIG. 2, the collected nitrogen may be compressed using a compressor to a pressure level of from 100 to 200 atmosphere. Alternatively, the arrangement may be modified such that a liquefying unit employing a turbine is used to liquefy the collected nitrogen, and the liquefied nitrogen is stored in an inner container.

In the arrangement of the present embodiment, most portions of the illumination optical system are housed in the second subchamber 6, and a portion of the second subchamber 6 is provided in the chamber 7. However, the arrangement may be modified such that the entirety of, for example, the second subchamber 6 is housed in the chamber 7. The modified arrangement enables the amount of impurities in the second subchamber 6 to be reduced.

In the arrangement of the above-described present embodiment, a single type of gas (rare gas such as nitrogen gas, helium gas, or neon gas) is fed to each of the first to fourth subchambers 1 to 42. However, a gas composed by mixing nitrogen gas and helium gas at a predetermined ratio may be fed into the individual subchambers. In this case, mixing elements are not limited to the nitrogen and helium gases; and a mixed gas with a different element, such as neon gas or hydrogen gas, may be used.

In addition, a transmissive and chemically stable gas may be used by changing the purity (concentration) for at least one of the first to fourth subchambers 1 to 42, the projection optical system PL, and load-lock chambers 26 and 44 and other configuration members. That is, the same type of gas may be used by changing the concentration of impurities (such as oxygen, water vapor, and organic substances) for the members. Alternatively, for the configuration members separated into three or more groups, the same type of gas may be used by changing the purity (impurity concentration).

The configurations, the supporting methods therefor, and the like are not limited to those of the individual units, such as the projection optical system, the reticle stage system, and the wafer stage system in the present embodiment (in FIGS. 1 and 2). Any configurations and supporting methods may be used as long as they are supported not to cause vibrations thereof to be propagated to each other.

The bellows 25, 36, and 43 need not be provided for all the above-described connected portions. The bellow may be provided only for one of the connected portions. In addition, bellows as mentioned above may be provided for connected portions when the illumination optical system or the projection optical system is separated and stored into a plurality of hermetic rooms. This applies as well to a case in which the reticle loader system 28 or the wafer loader system 45 is separated and stored into a plurality of hermetic rooms. In addition, bellows may be provided for connected portions between a lens housing provided for housing portions of the optical systems (for example, the interferometer main body portions 33 and 34, a reticle alignment system, a wafer alignment system, and an autofocus sensor), which are provided around the third subchamber 23 or the fourth subchamber 42, and the corresponding subchambers. Moreover, bellows may be provided for connected portions between the pipelines provided for feeding and exhausting purge gas and the above-described individual subchambers and the projection optical system.

In the above-described embodiment, although the ArF excimer laser is used as the exposure beam, a different laser is usable. A usable laser is any one of, for example, a KrF excimer laser (having a wavelength of 248 nm), an $F_2$ laser (having a wavelength of 156 nm), a $Kr_2$ laser (having a wavelength of 147 nm), and an $Ar_2$ laser (having a wavelength of 126 nm). The present invention is applicable also to exposure apparatuses having a light source of the different laser. However, in an exposure apparatus using, for example, a KrF excimer laser, air in a projection optical system need not be replaced with a gas such as nitrogen gas or helium gas. In this case, it is sufficient to replace only air in an optical source of the KrF excimer laser and in an illumination optical system with, for example, a nitrogen gas.

Furthermore, the present invention is applicable to a configuration using one of the following optical beams as an exposure beam instead of the excimer laser. The beams are those having wavelengths of, for example, 248 nm, 193 nm, and 157 nm, and harmonics of a solid state laser such as a YAG laser having a vibrational spectrum in the vicinity of each of the wavelengths.

Hereinbelow, a second embodiment of the present invention will be described with reference to the drawings. In the present embodiment, the present invention is applied to a projection exposure apparatus that employs a step-and-scan method in which vacuum ultraviolet light is used as an exposure beam.

In the exposure apparatus of the above-described first embodiment, lenses in the reticle stage system, the wafer stage system, and the projection optical system are housed in the hermetic units. In addition, spacings between the adjacent hermetic units are hermetically covered using the below mechanisms formed of metal or the like.

However, in the configuration using metal below mechanisms having a high rigidity, a case can occur in which the image-forming property of the projection optical system is lowered. This problem can occur for the reason that, for example, vibrations occurring when the wafer stage system, the reticle stage system, and the like are driven, and deformations of the hermetic units or the like caused by shift in the center of gravity (unbalanced loads) in the stage systems are propagated to the projection optical system through the below mechanisms. In addition, another problematic case can occur in which influences of vibrations and unbalanced loads occurring from the stage systems are propagated to, for example, the reticle interferometer and the alignment units, thereby reducing the measurement precision thereof. The influences of vibrations can be reduced to a certain extent through adjustment of the rigidity of the below mechanisms. However, preferably, such influences are further reduced.

To minimize the exposure of the inside of, for example, a reticle stage system and a wafer stage system, to the outside, researches are in progress for the provision of metal below mechanisms, for example, between a reticle loader system and a main body of an exposure apparatus and between a wafer loader and the main body of the exposure apparatus. Also in this case, however, a problematic case can occur in which influences of vibrations and unbalanced loads are propagated to the main body of the exposure apparatus, thereby lowering, for example, the image-forming property of a projection optical system and the measurement precision of a reticle interferometer and the like. Vibration-isolating mechanisms can be provided also for, for example, the reticle loader system and the wafer loader system to reduce reductions in, for example, the image-forming property and the measurement precision of the interferometer because of vibrations and unbalanced loads that occur in the loader systems. However, problems can arise in that influences of vibrations remain, and costs for manufacturing the exposure apparatus increase. In view of these problems, in the second embodiment, a description will be given regarding the example in which the vibration-isolating property is further improved.

FIG. 3 is a schematic configuration view showing a projection exposure apparatus according to the present embodiment. Referring to FIG. 3, although the projection exposure apparatus uses the source of ArF excimer laser light (having a wavelength of 193 nm), other light sources are usable. Usable light sources include an $F_2$ laser light source (having a wavelength of 157 nm), a $Kr_2$ laser light source (having a wavelength of 146 nm), a harmonics-generating unit for generating a YAG laser, and a light source such as a semiconductor-laser harmonics-generating unit for generating vacuum ultraviolet light (light having a wavelength of 200 nm or shorter in the present embodiment). However, also when, for example, a KrF excimer laser light source (having a wavelength of 248 nm) and mercury lamp (i-ray, etc.) is used for the exposure beam, the present invention can be used to increase the transmittance of the exposure beam.

Vacuum ultraviolet light is substantially absorbed by absorptive substances, such as oxygen, water vapor, hydrocarbon-based gas (for example, carbon dioxide), organic substances, and halogenide, which are included in the normal atmosphere. In view of the above, in a configuration using the vacuum ultraviolet light for the exposure beam as in the present embodiment, to prevent attenuation of the exposure beam, the gas concentration of the absorptive substances (impurities) needs to be reduced lower than or equal to a range of from 10 to 100 ppm. In the present embodiment, however, gas located in the optical path of the exposure beam is replaced with a gas transmitting the exposure beam, i.e., a gas such as a nitrogen ($N_2$) or a rare gas (which hereinbelow will be called "purge gas") formed of helium (He), neon (Ne), argon (Ar), krypton (Kr), xenon (Xe), or radon (Rn). The purge gas has a high-transmittance and chemically-stable property) and is composed by significantly removing absorptive substances.

While the nitrogen gas can be used as the gas (purge gas) transmitting the exposure beam even in a VUV radiation region when the wavelength thereof is up to a level of 150 nm, it works as an absorptive substance for light of which the wavelength is a level of 150 nm or shorter. As such, a rare gas is preferably used for the purge gas for an exposure beam having a wavelength of 150 nm or shorter. Among rare gases, a helium gas is preferably used in view of properties such as a stabilized refraction index and a high thermal conductivity, and the like. However, since helium is expensive, a different rare gas may be used when considering the operation costs and the like to be important. For the purge gas, not only one type of gas, but also a mixed gas as that composed by mixing nitrogen and helium at a predetermined ratio may be used.

In the present embodiment, considering the properties such as a stabilized refraction index (stabilized image-forming property) and a high thermal conductivity to be important, a helium gas is used for the purge gas. As such, a feeding/exhausting mechanism 113 is disposed. The feeding/exhausting mechanism 113 feeds a high-purity purge gas into the exposure apparatus of the present embodiment and a plurality of hermetic rooms associated with the projection exposure apparatus in a machine room located in a downstairs of a floor on which the projection exposure apparatus is disposed. In addition, the feeding/exhausting mechanism 113 collects the gas flowed in the hermetic rooms to enable the gas to be reused.

Hereinbelow, the configuration of the projection exposure apparatus according to the present embodiment will be described in more detail. A main body portion of the projection exposure apparatus of the present embodiment is situated on a base member 102C. A first frame 102A is disposed on the base member 102C and is shaped substantially as a gate including four or three leg portions (columns). An illumination optical system of the present embodiment is configured to include optical members such as an exposure light source and an optical integrator (such as a uniformizer or homogenizer). The optical members excluding the exposure light source are housed in a box-like first subchamber 103 having a highly hermeticality, and the first subchamber 103 is provided on an upper portion of the first frame 102A. An exposure beam (exposure light) formed of a pulse laser having a wavelength of 193 nm is emitted from the exposure light source (not shown) in the illumination optical system. The emitted exposure beam illuminates a pattern region of a pattern surface (lower surface) of a reticle R that is used as a mask. The exposure beam passed through the reticle R forms an image formed by reducing the pattern of the reticle R at a projection magnification β (β=¼, ⅕, etc.). The image is formed on a wafer W (substrate) through a projection optical system 104 provided as a projection system. The wafer W is a disc-like substrate, such as a silicon semiconductor or a SOI (silicon on insulator), and a photoresist is applied thereon. The individual reticle R and wafer W correspond to exposure-target substances of the present invention.

As in the case disclosed in Japanese Patent Application No. 10-370143 or No. 11-66769 for example, a cylindrical catadioptric system and a cylindrical dioptric system may be used for the projection optical system 104. The catadioptric system is configured to include a plurality of dioptric lenses and two concave lenses each having an opening near an optical axis. These lenses are arranged along the optical axis. On the other hand, the dioptric system is configured to include dioptric lenses arranged along one optical axis. Alternatively, a double-cylindrical catadioptric system may be used for the projection optical system 104. Hereinbelow, the configuration of the present embodiment will be described on a basis of X, Y, and Z axes as shown in the figure. The Z axis is established parallel to an optical axis of the projection optical system 104. The X axis established parallel to the sheet face of FIG. 3 in a plane that is perpendicular to the Z axis. The Y axis established perpendicular to the sheet face of FIG. 3. In this case, an illumination region on the reticle R is formed as a slit that is a long and narrow along the X direction, and the scanning direction for the reticle R and the wafer W during exposure is the Y direction.

The reticle R is held on a reticle stage 107b via a reticle holder 107a. The reticle stage 107b is driven according to a linear motor method to continually move on a reticle base 107c in the Y direction (scan direction), and concurrently, to finely adjust the position of the reticle R within an XY plane. When the reticle stage 107b moves in the Y direction, the reticle base 107c moves on a base member 121 in the direction opposing the movement direction of the reticle stage 107b in such a manner as to satisfy the law of conservation of momentum. Thereby, the reticle base 107c inhibits vibrations that can occur when the reticle stage 107b moves. The base member 121 is supported on support plates (shown in two portions in FIG. 3) provided on four intermediate portions (which may be three portions) of the first frame 102A via vibration-isolating members 123A and 123B. Each of the vibration-isolating members 123A and 123B is an active vibration-isolating unit formed by combining an air damper (which may alternatively be a hydraulic damper) and an electromagnetic actuator such as a VCM (voice coil motor). A reticle stage system RST is configured to include the reticle holder 107a, the reticle stage 107b, and the reticle base 107c. The reticle stage system RST is housed in a box-like second subchamber 108 (reticle room) having a high hermeticality.

A second frame 102B substantially shaped as a gate is disposed inside of the first frame 102A on an upper surface of the base member 102C via vibration-isolating members 124A and 124B (shown in two portions in FIG. 3) provided on four portions (which may be three portions). The projection optical system 104 is held in a central portion of an intermediate support plate of the base member 102. The vibration-isolating members 124A and 124B are active vibration-isolating units that are similar to the vibration-isolating members 123A and 123B. A laser interferometer 111 (reticle interferometer) is provided on an upper surface of the second frame 102B. The laser interferometer 111 and a movable mirror 119 provided on the reticle stage 107b are used to measure the position of the reticle stage 107b (reticle R) in the individual X and Y directions. In addition, as needs arises, the individual rotational angles around the X, Y, and Z axes are measured by using the laser interferometer 111 and the movable mirror 119. According to the measurement values, a control system (not shown) controls the position and the movement speed of the reticle stage 107b. On the other hand, a supporting frame 112 of the reticle alignment system is disposed on the second frame 102B, and a reticle alignment microscope (not shown) is fitted to an upper portion of the reticle stage 107b of the supporting frame 112.

The wafer W is held on a process-piece table 105a via a wafer holder (not shown), and the process-piece table 105a is fixedly arranged on an XY stage 105b. The XY stage 105b continually moves the process-piece table 105a (wafer W) on a wafer base 122 in the Y direction. As needs arises, the XY stage 105b step-moves the process-piece table 105a in each of the X and Y directions. The process-piece table 105a controls the wafer W for a focus position (position in the Z direction) as well as a slope angle around each of the X and Y axes. The XY stage 105b is driven by, for example, a drive section (not shown) using a liner motor method in such a manner as to satisfy the law of conservation of momentum. This inhibits vibrations that can occur when the XY stage 105b is driven. The wafer base 122 is disposed on the base member 102C via vibration-isolating members 125A and 125B (shown in two portions in FIG. 3) provided on four portions (which may be three portions). The projection optical system 104 is held in a central portion of an intermediate support plate of the base member 102. The vibration-isolating members 125A and 125B are active vibration-isolating units that are similar to the vibration-isolating members 123A and 123B. A wafer stage system WST is configured to include the process-piece table 105a and the XY stage 105b. The wafer stage system WST is housed in box-like third subchamber 106 (wafer room) having a high-hermeticality.

A laser interferometer 109 (wafer interferometer) is fixedly arranged on an intermediate of the second frame 102B. A side face of the process-piece table 105a is formed as a movable mirror. The laser interferometer 109 and the movable mirror of the process-piece table 105a work together to measure the position of the process-piece table 105a (wafer W) in each of the X and Y directions as well as the rotational angle thereof around each of X, Y, and Z axes. According to the measurement values, a stage control system (not shown) controls operation of the XY stage 105b. For example, a multipoint optical autofocus sensor 110 (AF sensor) employing a grazing incidence method is fixedly arranged on an intermediate support plate of the second frame 102B. In addition, the process-piece table 105a controls the wafer W for the focus position of the wafer W as well as slope angle thereof about each of the X, Y, and Z axes according to information on focus positions at multiple measurement points on the wafer W measured by the optical autofocus sensor 110. The process-piece table 105a performs the above control by employing an autofocus method and an auto-leveling method. Thereby, the surface of the wafer W is focally aligned with an image continually in the projection optical system 104 during exposure.

In addition, a wafer alignment system 114 is fixedly arranged onto the base member 102. The wafer alignment system 114 employs an off-axis method and an image-forming method to align the wafer W. Moreover, the configuration includes an interface column 117 that houses a reticle loader system RRD and a wafer loader system WRD. The reticle loader system RRD performs delivery of the reticle R between itself and the reticle stage system RST. The wafer stage system WST performs delivery of the wafer W between itself and the wafer stage system WST. In the interface column 117, gate valves 115 and 116 are provided, respectively, at a transfer opening used for delivery of reticles and at a transfer opening used for delivery of wafers. The gate valves 115 and 116 are thus provided to minimize exposure of the respective reticle stage system RST and wafer stage system WST to the outside.

In a scan-exposure operation, upon completion of an exposure of one shot area of the wafer W, the subsequent shot area is moved to a scan commencement position according to the step movement of the XY stage 105b. Thereafter, synchronous scanning is performed for the reticle stage 107b and the XY stage 105b on the wafer side by using a projection magnification β of the projection optical system 104 as a velocity ratio. Specifically, operation in a state in which the image-forming relationship between the reticle R and the shot area of the wafer W is maintained is iterated according to the step-and-scan method. Thereby, a pattern image is serially transferred onto individual shot areas of the wafer W.

The projection exposure apparatus of the present embodiment includes the feeding/exhausting mechanism 113 for replacing (purges) gas in spacings including the optical path of the exposure beam with gas (purge gas). A portion of the illumination optical system, the reticle stage system RST, and the wafer stage system WST are housed, respectively, in the subchambers 103, 108, and 106 each having a high hermeticality. Spacings between the individual optical members in the projection optical system 104 are arranged as lens rooms having a high hermeticality (the lens rooms also correspond to hermetic rooms). A high-purity purge gas is fed by the feeding/exhausting mechanism 113 into the subchambers 103, 108, and 106. In addition, a high-purity purge gas is fed into the individual lens rooms in the projection optical system 104 (which hereafter will be described in detail).

Filmy covers 101A to 101D each having a high flexibility are provided, respectively, in a boundary portion between the first subchamber 103 and an upper portion of the second subchamber 108, a boundary portion between a bottom surface of the base member 121 and an upper surface of the second frame 102B, a boundary portion between an upper end portion of the projection optical system 104 and an upper surface of the second frame 102B, and a boundary portion between a bottom surface of an intermediate support plate of the second frame 102B and an upper surface of the third subchamber 106. The covers 101A to 101D are provided in such a manner as to separate the individual in side spacings from the outside. In addition, flexible cylindrical filmy covers 118A and 118B are provided between the second subchamber 108 and the third subchamber 106 and the gate valves 115 and 116 in the interface column 117. The filmy covers 101A to 101D, 118A, and 118B correspond to flexible filmy covering members of the present invention. These filmy covers can also be called soft shield members or bellows each having an extremely low rigidity. Since the filmy covers 101A to 101D, 118A, and 118B substantially hermetically enclose the boundary portions, the optical path of the exposure beam is almost completely hermetic-enclosed. As such, almost no gas containing absorptive substances intrudes from the outside, and the attenuation amount can be reduced subsequently low.

The feeding/exhausting mechanism 113 is configured of a collecting section for collecting purge gas, a storage section for storing high-purity purge gas, and a feeding section for regulating the purge gas in temperature and feeding the gas to the outside. The feeding/exhausting mechanism 113 thus configured individually feeds the high-purity purge gas into the subchambers 103, 108, and 106 and the projection optical system 104 via a feed pipeline 126 at a gas pressure (positive pressure) that is slightly higher than the atmospheric pressure. In addition, via an exhausting pipeline 127 having a valve V, the feeding/exhausting mechanism 113 collects impurity- containing purge gas that flowed inside of each of the subchambers 103, 108, and 106 and the projection optical system 104. Furthermore, the feeding/exhausting mechanism 113 separates purge gas from the collected gas; and then, it compresses the separated purge gas at a high pressure; or alternatively, it liquefies the purge gas and temporarily stores it. An example configuration is described hereinbelow. For example, impurity sensors for measuring the concentration of oxygen as absorptive substance are provided inside of the subchambers 103, 108, and 106 and the projection optical system 104. Suppose the concentration of the absorptive substance that was detected by each of the impurity sensors has exceeded a predetermined tolerance value. In this case, collection of gas via the exhausting pipeline 127 and compensatory feed of the high-purity purge are implemented according to a gasflow control method that controls gas having substantially constant pressure (slightly higher than the atmospheric pressure) to flow. As such, even in the configuration using the highly flexible filmy covers filmy covers 101A to 101D, 118A, and 118B, no excessively great force exerts on the filmy covers filmy covers 101A to 101D, 118A, and 118B.

In the above, the tolerance value of the concentration may be arranged to be variable depending on the type of absorptive substance as in an arrangement in which a tolerance value for the concentration for organic substance is set lower than a tolerance value for the concentration of carbon dioxide. In addition, an arrangement may be made such that portions where the reticle loader system RRD and the wafer loader system WRD are housed in the interface column 117 are hermetically enclosed, and the purge gas is fed into the spacings. In this case, the arrangement may be made such that the purge gas used to process the collected gas as described above from the subchambers 103, 108, and 106 and the projection optical system 104 is fed into the interface column 117; and an unused high-purity purge gas stored in the purge-gas storage section is fed into the subchambers 103, 108, and 106 and the projection optical system 104.

The tolerance value for the concentration of impurities in the above-described individual subchambers and the projection optical system is not limited to the above- described tolerance value (10 to 100 ppm). The value may be different depending on the place.

In addition, when the purge gas is fed, the feeding/exhausting mechanism 113 regulates, for example, the temperature, humidity, and the pressure of the purge gas to be fed. Concurrently, the feeding/exhausting mechanism 113 removes the above-described absorptive substances and the like from the purge gas by using a dust-removing filter such as a HEPA filter (high efficiency particulate air-filter) and a chemical filter for removing the above-described absorptive substances containing organic substances and the like. Substances to be removed include substances that adhere to optical elements used in the projection exposure apparatus to thereby cause the elements to be cloudy. The impurities to be removed also include substances that flow in the exposure-beam optical path and causes variations in, for example, the transmittance (illuminance) or the illuminance distribution of the illumination optical system and the projection optical system. In addition, the impurities to be removed include substances that adhere onto a surface of the wafer W (resist) to thereby cause a postdevelopment pattern image to vary. A usable filter is an active-carbon filter (for example, "GIGAS-ORB" (brand name) produced by Nitta Corp.), a zeolite filter, or a filter formed by combining the filters. The filters remove silicon organic substances, such as siloxanes (substance containing a chain of Si—O as a base) or silazanes (substance containing a chain of Si—N as a base).

As described above, by replacing the ambient atmosphere of the optical path of the exposure beam, the transmittance for the exposure beam is highly maintained. Accordingly, the illuminance of the exposure beam led to be incident on each shot area is increased. Consequently, this reduces the exposure time for each shot area, thereby enabling the throughput to be improved.

In addition, in the present embodiment, optical paths of measurement beams of optical measuring units, such as the laser interferometers 109 and 111 and the optical autofocus sensor 110, are set in the ambient atmosphere of the purge gas. This arrangement inhibits measurement errors from occurring because of fluctuations in gas along the optical paths of the optical measuring units.

Next, referring to FIGS. 4 and 5, a detailed description will be made regarding the filmy covers 101A to 101D, 118A, and 118B. Hereinbelow, a configuration of the representative filmy cover 101A will be described.

FIG. 4 shows a state in which the filmy cover 101A is set. Referring to FIG. 4, flanges 130 and 131 formed of, for example, metal such as aluminum, or ceramics, are provided at two ends of the filmy cover 101A. The filmy cover 101A is set in such a manner as to cover a portion between the lower end of the first subchamber 103 and the upper end of the second subchamber 108 via the flanges 130 and 131. The flanges 130 and 131 are fixed onto fit planes. In this case, to increase the hermeticality, for example, O-rings formed of a material having a low-degasification property (such as a fluorine-based resin) may be placed between the flanges 130 and 131 and the fit planes.

FIG. 5 is a thickness-wise-enlarged transverse cross sectional view showing the filmy cover 101A shown in FIG. 3. As shown in FIG. 5, the filmy cover 101A of the present embodiment is formed as follows. A protection film 101$d$ is coated on an outer surface of a film material 101$c$ via an adhesive. The film material 101$c$ is made of an ethylene-vinyl-alcohol resin (EVOH resin). The protection film 101$d$ has a high expandability and is formed of polyethylene (—$(CH_2CH_2)_n$—). In addition, a stabilization film 101$b$ made of aluminum (Al) is coated on an inner surface in a manner of, for example, deposition. The ethylene-vinyl-alcohol resin (EVOH resin), for example, "EVAL" (brand name) produced by Kuraray Co., Ltd. may be used. The stabilization film 101$b$ is preferably formed of a material that does not cause degasification or that has a very low degasification property.

The filmy cover 101A is formed such that lamination processing (multilayer processing) is performed for the protection film 101$d$ (third material) and the film material 101$c$ (first material), and the stabilization film 101$b$ (second material) is coated in the inner surface thereof. The protection film 101$d$ is inherently excellent in expandability, the film material 101$c$ is excellent in gas-barrier property, and the stabilization film 101$b$ has a significantly low degasification property. The overall thickness of the filmy cover 101A is about 0.1 mm. To cylinderically form the filmy cover 101A, an end portion A is formed such that two end portions of the protection film 101$d$, which has a high weldablility, are connected to oppose each other, and are welded together; and the welded portion is completely hermetically enclosed.

In this case, while the protection film 101$d$ has a high expandability, it has disadvantages in that the gas-barrier property is relatively low, degasification can easily occur, and metal and the like cannot easily be attached to an inner surface thereof. Taking the above into account, the present embodiment is arranged as follows. The film material 101$c$ is formed that has a high gas-barrier property to enable the prevention of intrusion of outside air as well as leakage of the purge gas. In addition, the film material 101$c$ onto which metal and the like can easily be attached is formed, and the stabilization film 101$b$ is formed in the inside thereof. Furthermore, the stabilization film 101$b$ prevents the adhesive used to form the filmy cover 101A and degasification-produced gas occurring as a result of heat-sealing and the like to intrude into the inside of the filmy cover 101A, that is, the optical path of the exposure beam. Still furthermore, a shielding property against gas is even more improved since the stabilization film 101b is applied onto the inner surface.

As described above, the filmy cover 101A of the present embodiment is formed of the materials, such as the film material 101c having a high flexibility, that is, a very low rigidity and a high gas-barrier property. As such, in comparison to the configuration using only the metal below mechanisms, an equivalent gas-barrier property is obtained, and in addition, almost no vibrations are propagated between the first subchamber 103 and the second subchamber 108 (reticle room), which are shown in FIG. 3. Moreover, the other filmy covers 101B to 101Dm 118A, and 118B are formed in the same manner as that for the above-described filmy cover 101A. As such, vibrations are not easily propagated between the adjacent hermetic rooms.

Accordingly, almost no influences of vibrations and unbalanced loads in, for example, the reticle stage system RST and the wafer stage system WST, which are shown in FIG. 3, are propagated to, for example, the projection optical system 104 and the second frame 102B. That is, the configuration enables the reduction in the image-forming property of the projection optical system 104 according to the defective vibrations and unbalanced loads to be minimized. Consequently, the configuration enables high-precision exposures to be implemented. In addition, the configuration enables the inhibition of occurrence of measurement errors that can occur with the laser interferometers 109 and 111, the supporting frame 112 for the reticle alignment system, the wafer alignment system 114, and the optical autofocus sensor 110 that are fitted to the second frame 102B.

In addition, in the present embodiment, the filmy covers 118A and 118B are disposed, respectively, between the reticle stage system RST (second subchamber 108) and the interface column 117 and between the wafer stage system WST (third subchamber 106) and the interface column 117. This configuration enables the prevention of vibrations occurring in the reticle loader system RRD and the wafer loader system WRD in the interface column 117 to propagate to the main body of the projection exposure apparatus. Furthermore, the gate valves 115 and 116 are provided on the side of the interface column 117. The configuration enables influences of vibrations occurring by on/off operations of the gate valves 115 and 116 to be inhibited.

The material used for the filmy covers 101A to 101D, 118A, and 118B is not limited to the ethylene-vinyl-alcohol resin. Any material may be used as long as it has a high shielding property against gas and a high flexibility. Usable materials therefor are, for example, polyamide, polyimide, and polyester. As a material having a highest gas-barrier property, the ethylene-vinyl-alcohol resin is preferable. As a material that is inexpensive and hence economical, a polyester material is preferable. In view of cost performance, polyamide or polyimide is preferably used.

The material to be coated as the protection film 101d onto the inner surface of the filmy covers 101A to 101D, 118A, and 118B is not limited to the aluminum used in the present embodiment. Any material, including other metals and inorganic materials such as ceramics, may be used as long as it has a high reactivity to an exposure beam such as vacuum ultraviolet light and a low degasification property. Moreover, for the protection film 101d, instead of polyethylene, polypropylene may be used.

In the configuration used with a small differential between pressures in, for example, the hermetic rooms (such as the subchamber 103) and the outside, each of the filmy covers 101A to 101D, 118A, and 118B may be formed only of the film material 101c and the stabilization film 101b. Moreover, in the configuration in which, for example, the amount of degasification is small, each of the filmy covers 101A to 101D, 118A, and 118B may be formed only of the film material 101c.

The number of filmy covers as the filmy covers 101A to 101D, 118A, and 118B and the provision portions thereof are not limited to those in the configuration of the present embodiment. The filmy covers may be optionally provided to hermetically enclose the optical path of the exposure beam or to hermetically enclose portions communicated with the optical path (such as the provision portion of the reticle loader system RRD). For example, in a configuration in which each stage system is driven using a counterbalance to satisfy the law of conservation of momentum, the filmy covers may be provided in a spacing between the counterbalance and a movable stage of the stage system.

Hereinbelow, another example of the filmy cover (covering members) will be described with reference to FIGS. 6A and 6B.

FIG. 6A shows a filmy cover 141 of the present example. Similar to the above-described filmy covers 101A to 101D, 118A, and 118B, the filmy cover 141 of the present embodiment is formed by laminating materials such as a film material having a high gas-barrier property and a protection film having a high expandability. As described above, each of the filmy covers 101A to 101D, 118A, and 118B is cylindrically formed by welding end portions of the protection film 101d that are held to oppose each other. However, the filmy cover 141 of the present example is formed such that joint portions of a member cylindrically bend-formed are connected using a protection film 141a attached such as to cover the joint portions.

In more specific, as shown in FIG. 6B, the filmy cover 141 of the present example is formed as follows. A polyethylene protection film 141d having a high expandability is applied on an outer surface of a film material 141c made of an ethylene-vinyl-alcohol resin via an adhesive 141e. Then, a protection film 141a having a high weldability is welded or adhered with an adhesive in such a manner as to cover the outside of the outer joint portions. In addition, similarly to each of the above-described filmy covers 101A to 101D, 118A, and 118B, a stabilization film 141b made of aluminum is applied onto an inner surface of the film material 141c in a manner of, for example, deposition. An overall thickness d1 of the filmy cover 141 is about 0.1 mm. A thickness d2 of the connection-dedicated protection film 141a used to cylindrically form the filmy cover 141 is about 0.03 mm.

In the filmy cover 141 thus formed by using the material such as the protection film 141a having a high weldability to connect two end portions, uneven (or stepped) portions tending to cause impurities to stay on the inner surface of the filmy cover 141 are reduced. In addition, in the above-described construction, the amount of leakage of the purge gas is reduced. As such, the construction is advantageous in that the inside of the filmy cover 141 can be purged even more efficiently.

To provide a simplest construction of the connected portion of the filmy cover, the construction may be made such that an outer surface of one end portion is simply overlapped with an inner surface of the other end portion by a predetermined width, and the overlapped portions are fixed by adhesion or welding.

The above-described filmy covers 101A to 101D, 118A, 118B, and 141 are formed of planar materials. However, filmy covers as covering members may be individually formed as a bellows. With the covering members formed as a bellows, a fitting procedure of the cover members can be simplified, or the durability against inside and outside pressures can be improved depending on the case.

The covering members as the filmy covers 101A to 101D, 118A, 118B, and 141 need not be provided in all the above-described connected portions, and may be provided in at least one connected portion. Moreover, when the illumination optical system or the projection optical system is separated and stored into a plurality of hermetic rooms. This applies as well to a case in which the reticle loader system RRD or the wafer loader system WRD is separated and stored into a plurality of hermetic rooms. In addition, filmy covers may be provided for connected portions between a lens housing provided for housing portions of the optical systems (for example, the wafer alignment system 114, the optical autofocus sensor 110, and the laser interferometers 109 and 111), which are provided around the second subchamber 108 or the third subchamber 106, and the corresponding subchambers. Moreover, filmy covers may be provided in connected portions between the pipelines provided for feeding and exhausting purge gas and the above-described individual subchambers and the projection optical system.

Also in the projection exposure apparatus of the first embodiment (shown in FIG. 1), instead of the bellows 25, 36, and 43, the filmy covers of the second may be employed. Alternatively, the stabilization film 101b of the second embodiment may be provided in an inner surface of each of the bellows 25, 36, and 43. Moreover, while the bellows of the first embodiment or the filmy covers of the second embodiment are each formed to have an inner surface formed of a material having a low degasification property, a case may occur in which degasification-caused gas occurs. In such a case, a suction pipe is preferably connected to a portion of the bellows or the filmy cover to collect the degasification-caused gas.

Each of the above-described embodiments represents the example of the present invention applied to the projection exposure apparatus employing the step-and-scan method. However, it should be apparent that the present invention can be applied to a projection exposure apparatus of a full-field-exposure type as well as to a mirror-projection exposure apparatus and proximity exposure apparatus that does not use a projection optical system.

In a configuration using a projection optical system, an optical system therefor may be any one of a dioptric system, a reflection system, and a catadioptric system. Furthermore, the optical system may be of any one of an image-reduction system, an image-equalization system, and an image-magnification system.

While the present invention can be applied to exposure apparatuses used for manufacturing microdevices such as semiconductor devices, thin-film magnetic heads, and image pickup devices (charge-coupled devices (CCDS)), the present invention can also be applied to an exposure apparatus for transferring circuit patterns onto, for example, glass substrates or silicon wagers, to manufacture reticles or masks. Generally, in an exposure apparatus using, for example, DUV (deep ultraviolet) light, or VUV (vacuum ultraviolet) light, a transmission reticle is used. In addition, the apparatus uses for example, quarts glass, fluorine-doped quarts glass, fluorite, magnesium fluoride, or quarts, as a reticle substrate. In an exposure apparatus using EUV (extreme ultraviolet) light, a reflection mask is used as an exposure energy beam. In a proximity X-ray exposure apparatus or an electron-beam exposure apparatus, a transmission mask (such as a stencil mask or membrane mask) is used; and a silicon wafer or the like is used as a mask substrate.

In addition, the present invention can be applied to a case where, for example, an infrared-region or visible-region mono-wavelength laser generated from a DFB semiconductor laser or a fiber laser is amplified by a fiber amplifier doped with, for example, erbium (Er) (or both erbium and ytterbium (Yb)), and a harmonics converted in wavelength into ultraviolet light by using nonlinear optical crystal.

In more specific, when a generation wavelength of the mono-wavelength laser is set within a range of from 1.51 to 1.59 $\mu$m, there is output either an eight-fold harmonics in which the generated wavelength is within a range of from 189 to 199 nm or a ten-fold harmonics in which the generated wavelength is within a range of from 151 to 159 nm. In particular, when the generation wavelength is set within a range of from 1.544 to 1.553 $\mu$m, there is output an eight-fold harmonics in a range of from 193 to 194 nm. That is, ultraviolet light having substantially the same wavelength as that of an ArF excimer laser can be obtained. In addition, when the generation wavelength is set within a range of from 1.57 to 1.58 $\mu$m, there is output a ten-fold harmonics in a range of from 157 to 158 nm. That is, ultraviolet light having substantially the same wavelength as that of an $F_2$ laser can be obtained.

Either one of the exposure apparatuses according to the above-described two embodiments can be fabricated in the following manner. The illumination optical system and the projection optical system, which are configured to include a plurality of optical elements, are built into the main unit of the exposure apparatus, and optical adjustment is performed. Then, for example, the reticle stage and wafer stage configured of a large number of mechanical components are assembled into the main unit of the exposure apparatus; and wirings, pipelines, and the like are connected therein. The individual subchambers, the projection optical system, and the like are individually connected to, for example, the gas-circulating unit. Then, a total adjustment (including electrical adjustment and operational verification) is performed. Preferably, an exposure apparatus as described above is fabricated in a clean room controlled in temperature, cleanliness, and other environmental factors.

A semiconductor device is manufactured according to, for example, the following procedure. The procedure include a step of designing functions and performance of the device; a step of manufacturing a reticle according to the design step; a step of manufacturing a wafer from a silicon material; a step of performing an exposure operation for a reticle pattern onto the wafer; a device-assembling step (including a dicing step, a bonding step, and a packaging step); and testing step.

The present invention is not limited to the above-mentioned embodiments, and the invention may be embodied in various forms without departing from the gist of the present invention. Furthermore, the entire disclosure of Japanese Patent Application 11-149598 filed on May 28, 1999 and Japanese Patent Application 2000-51106 filed on Feb. 28, 2000 including description, claims, drawings and abstract are incorporated herein by reference in their entirety.

INDUSTRIAL APPLICABILITY

According to the first exposure method of the present invention, a projection system and stage systems are supported not to easily propagate vibrations to each other. As such, vibrations in movable sections of the stage systems are not easily propagated to, for example, the projection system. Furthermore, the positions of the movable sections can be measured. Consequently, the exposure method is advantageous in that the control precision of the movable sections can be improved.

According to the first exposure apparatus, individually stage systems and a projection system connected independently of each other via vibration-isolating members. As such, vibrations are not easily propagated between the individual stage systems and the projection system. Consequently, the first exposure method of the present invention can be applied to the apparatus.

In the above, the apparatus is configured such that the projection system is constructed hermetic, chambers individually enclosing a portion of an illumination system and each of the stage systems, and flexible connection members are provided for hermetically enclosing individual portions between the individual chambers and the projection system. In this configuration, when a high-transmittance gas is fed into at least a portion of an optical path of an exposure beam, the intrusion amount of an outside gas is reduced. Furthermore, the illumination of the exposure can be highly maintained. Consequently, the throughput of an exposure step is improved.

According to the second exposure method or one of the second and the third exposure apparatuses, the luminous quantity of an exposure beam used is highly maintained. In addition, even when vibrations occur in a hermetic room, the apparatus exhibits an advantage in that the vibrations are not propagated to other hermetic rooms. For example, even when vibrations have occurred by moving an object of the above, the image-forming property of the projection optical system, the measurement precision of a laser interferometer, and the like are not degraded. Consequently, a high-throughput and high-precision exposure can be implemented.

Furthermore, according to the device-manufacturing method of the present invention, by using the exposure method or the exposure apparatus of the present invention, a high-precision exposure can be implemented. Moreover, a high-function-level device can be manufactured.

What is claimed is:

1. An exposure apparatus which transfers a pattern of a mask onto a substrate, comprising:
a covering member which is disposed in said exposure apparatus and which substantially isolates a predetermined spacing from outside gas, wherein
said covering member includes a first thin film made of a first material which blocks penetration of the outside gas with respect to the predetermined spacing, a second thin film made of a second material of at least one of a metal and an inorganic substance, and a third thin film made of a third material having an elasticity, the third thin film being formed on an outer surface of said covering member.

2. An exposure apparatus as recited in claim 1, wherein said second thin film is formed on an inner surface of said first thin film.

3. An exposure apparatus as recited in claim 2, wherein the third thin film is formed on an outer surface of said first thin film.

4. An exposure apparatus as recited in claim 3, wherein said third thin film is formed by lamination processing with respect to said first thin film.

5. An exposure apparatus as recited in claim 4, wherein said covering member is formed in a cylindrical shape, and said cylindrical shape is formed by securing said third material to itself at both end portions of said covering member in a state in which said covering material of a sheet shape is rolled into the cylindrical shape.

6. An exposure apparatus as recited in claim 4, wherein said third material at both end portions of said covering member is secured to itself by welding.

7. An exposure apparatus as recited in claim 2, wherein said second thin film is formed by evaporating and depositing said second material onto said first thin film.

8. An exposure apparatus as recited in claim 3, wherein
the first material is at least one of ethylene-vinyl-alcohol, polyamide, polyimide and polyester,
the second material is at least one of aluminum and ceramics, and
the third material is polyethylene.

9. An exposure apparatus as recited in claim 3, wherein said first thin film and said second thin film are secured to each other by an adhesive.

10. An exposure apparatus as recited in claim 1, wherein said predetermined spacing is a part spacing of an optical path spacing for an exposure beam which transfers said pattern of said mask onto said substrate.

11. An exposure apparatus as recited in claim 10, further comprising:
an illumination system which illuminates said mask;
a first chamber which accommodates said illumination system; and
a second chamber which accommodates a first stage system which positions said mask, wherein
said predetermined spacing is a space between said first chamber and said second chamber.

12. An exposure apparatus as recited in claim 10, further comprising:
a projection system which transfers said pattern of said mask onto said substrate; and
a third chamber which accommodates said second chamber which positions said substrate, wherein
said predetermined spacing is a spacing between said projection system and said third chamber.

13. An exposure apparatus as recited in claim 1, further comprising:
two hermetic rooms which are disposed in said exposure apparatus and which are adjacent to each other, wherein
said covering member is disposed between said two hermetic rooms and isolates a spacing between said two hermetic rooms from the outside gas as said predetermined spacing.

14. An exposure apparatus as recited in claim 13, wherein one of said two hermetic rooms accommodates said first stage system, and
the other of said two hermetic rooms accommodates a loader system which transfers said mask to said first stage system.

15. An exposure apparatus as recited in claim 13, wherein one of said two hermetic rooms accommodates said second stage system which positions said substrate, and
the other of said two hermetic rooms accommodates a loader system which transfers said substrate to said second stage system.

16. An exposure apparatus as recited in claim 1, wherein said covering member is formed in a bellow shape.

17. An exposure method which transfers a pattern of a mask onto a substrate, comprising:
isolating a part spacing of an optical path spacing for an exposure beam which transfers said pattern of said mask onto said substrate from outside gas by using a covering member which includes a first thin film made of a first material which blocks penetration of the outside gas with respect to said part spacing, a second thin film made of a second material of at least one of a metal and an inorganic substance, and a third thin film made of a third material having an elasticity, the third thin film being formed on an outer surface of said covering member, supplying gas through which said exposure beam passes to said part spacing which is isolated from the outside gas by said covering member, and transferring said pattern of said mask onto said substrate in a state in which said gas is supplied to said part spacing.

18. An exposure method as recited in claim 17, wherein said second thin film is formed on an inner surface of said first thin film.

19. An exposure method as recited in claim 18, wherein the third thin film is formed on an outer surface of said first thin film.

20. An exposure method as recited in claim 19, wherein said third thin film is formed by lamination processing with respect to said first thin film.

21. An exposure method as recited in clam 20, wherein the first material is at least one of ethylene-vinyl-alcohol, polyamide, polyimide and polyester,
the second material is at least one of aluminum and ceramics, and
the third material is polyethylene.

22. An exposure method as recited in claim 18, wherein said second thin film is formed by evaporating and depositing said second material onto said first thin film.

23. An exposure method as recited in claim 17, wherein said part spacing is a spacing between an illumination system which illuminates said mask and a projection optical system which transfers said pattern of said mask onto said substrate.

24. A device manufacturing method, comprising
transferring a mask pattern onto a substrate by using the exposure method as recited in claim 17.

25. An exposure apparatus which transfers a pattern of a mask onto a substrate, comprising:

a covering member which is disposed in said exposure apparatus and which substantially isolates a predetermined space from outside gas, wherein said covering member includes a first thin film made of a first material which has a expandability and which generates degasification-caused gas, said first thin film forming an outer surface of said covering member, a second thin film which is disposed on a side of said predetermined space with respect to said first thin film and which is made of a second material, said second thin film blocking the degasification-caused gas from penetrating into said predetermined space, and a third thin film made of a third material and disposed between said first thin film and said second thin film, said first thin film being joined on said second thin film with said third thin film, and said third thin film blocking the outside gas from penetrating into said predetermined space.

26. An exposure apparatus as recited in claim 25, wherein
the first material is polyethylene,
the second material is at least one of aluminum and ceramics, and
the third material is at least one of ethylene-vinyl-alcohol, polyamide, polyimide and polyester.

27. An exposure apparatus as recited in claim 25, wherein said first thin film and said third thin film are secured to each other by an adhesive.

* * * * *